United States Patent
Morikita et al.

(10) Patent No.: US 9,412,618 B2
(45) Date of Patent: Aug. 9, 2016

(54) PATTERN FORMING METHOD

(71) Applicant: Tokyo Electron Limited, Tokyo (JP)

(72) Inventors: Shinya Morikita, Beaverton, OR (US); Eiichi Nishimura, Miyagi (JP); Fumiko Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/776,886

(22) PCT Filed: Apr. 9, 2014

(86) PCT No.: PCT/JP2014/060307
§ 371 (c)(1),
(2) Date: Sep. 15, 2015

(87) PCT Pub. No.: WO2014/171377
PCT Pub. Date: Oct. 23, 2014

(65) Prior Publication Data
US 2016/0042970 A1  Feb. 11, 2016

(30) Foreign Application Priority Data
Apr. 16, 2013 (JP) .................................. 2013-085940

(51) Int. Cl.
*H01L 21/311* (2006.01)
*H01L 21/02* (2006.01)
(Continued)

(52) U.S. Cl.
CPC ...... *H01L 21/31133* (2013.01); *B81C 1/00031* (2013.01); *G03F 7/0002* (2013.01);
(Continued)

(58) Field of Classification Search
CPC ................... H01L 21/02118; H01L 21/31133; H01L 21/0271; H01L 21/31138; H01J 37/32091; H01J 37/32577; B81C 1/00031
USPC ........ 216/67–71; 430/311–319; 438/689–757
See application file for complete search history.

(56) References Cited

U.S. PATENT DOCUMENTS

| | | | |
|---|---|---|---|
| 2008/0041818 A1* | 2/2008 | Kihara | B82Y 10/00 216/41 |
| 2008/0299774 A1* | 12/2008 | Sandhu | H01L 21/0337 438/696 |
| 2011/0244691 A1 | 10/2011 | Mochiki | |

FOREIGN PATENT DOCUMENTS

| | | |
|---|---|---|
| JP | 02-024661 A | 1/1990 |
| JP | 2007-208255 A | 8/2007 |

(Continued)

OTHER PUBLICATIONS

International Search Report for PCT/JP2014/060307 dated Jul. 8, 2014.

*Primary Examiner* — Karen Kusumakar
(74) *Attorney, Agent, or Firm* — Pearne & Gordon LLP (57) ABSTRACT

A pattern forming method of forming a pattern on an underlying layer of a target object includes forming a block copolymer layer, which includes a first polymer and a second polymer and is configured to be self-assembled, on the underlying layer; processing the target object to form a first region containing the first polymer and a second region containing the second polymer in the block copolymer layer; etching the second region partway in a thickness direction thereof in a capacitively coupled plasma processing apparatus after the processing of the target object; generating secondary electrons from an upper electrode of the plasma processing apparatus by applying a negative DC voltage to the upper electrode and irradiating the secondary electrons onto the target object, after the etching of the second region; and additionally etching the second region in the plasma processing apparatus after the irradiating of the secondary electrons.

2 Claims, 6 Drawing Sheets (51) Int. Cl.
  *H01J 37/32* (2006.01)
  *B81C 1/00* (2006.01)
  *H01L 21/027* (2006.01)
  *G03F 7/00* (2006.01)

(52) U.S. Cl.
  CPC ..... *H01J 37/32091* (2013.01); *H01J 37/32577* (2013.01); *H01L 21/0271* (2013.01); *H01L 21/02118* (2013.01); *H01L 21/02351* (2013.01); *H01L 21/31138* (2013.01); *H01L 21/31144* (2013.01); *B81C 2201/0149* (2013.01)

(56) References Cited

FOREIGN PATENT DOCUMENTS

| | | |
|---|---|---|
| JP | 2008-043873 A | 2/2008 |
| JP | 2010-0192668 A | 9/2010 |
| JP | 2010-269304 A | 12/2010 |
| JP | 2011-199243 A | 10/2011 |
| JP | 2013-033856 A | 2/2013 |
| WO | 2011/036816 A1 | 3/2011 |

* cited by examiner

PATTERN FORMING METHOD

CROSS-REFERENCE TO RELATED APPLICATION

This Application is a U.S. national phase application under 35 U.S.C. §371 of PCT Application No. PCT/JP2014/060307 filed on Apr. 9, 2014, which claims the benefit of Japanese Patent Application No. 2013-085940 filed on Apr. 16, 2013, the entire disclosures of which are incorporated herein by reference.

TECHNICAL FIELD

The embodiments described herein pertain generally to a method of forming a pattern on an underlying layer of a target object, and more particularly, to a method of forming a pattern with a self-assembled block copolymer layer.

BACKGROUND

In order to achieve advanced miniaturization of devices such as semiconductor devices, it is necessary to form a pattern having a smaller dimension than a critical dimension obtained by microprocessing with the conventional photolithography. As one of methods for forming such a pattern, EUV (Extreme Ultraviolet), which is a next-generation exposure technology, is under development. A wavelength of a EUV light source is remarkably shorter than a wavelength of a conventional UV light source, and for example, a very short wavelength of 13.5 nm is used. Accordingly, in the EUV, there is a technical barrier to mass production, and a problem such as a longer exposure time is yet to be solved. Therefore, it is required to develop a method of manufacturing a further miniaturized device.

For this purpose, a technology for forming a pattern using a self-assembled block copolymer (BCP) as one of self-assembled materials capable of forming organized patterns by themselves has attracted attention. Such a technology is described in Patent Documents 1 and 2.

In Patent Document 1, a block copolymer layer, which includes a block copolymer containing at least two polymer block components A and B that are not mixed with each other, is coated on an underlying layer. Thereafter, a heat-treatment (annealing) is performed in order to phase-separate the polymer block components A and B by themselves. Thus, an organized pattern including a first region containing the polymer block component A and a second region containing the second polymer block component B can be obtained. Further, in Patent Document 2, as a method of forming a via, there is proposed a processing of patterning a block copolymer. According to the patterning processing described in Patent Document 2, in a first region and a second region of a phase-separated block copolymer layer, the second region is removed between the first region and the second region, so that a pattern can be obtained.

A dimension of the pattern obtained by patterning a block copolymer layer described in Patent Documents 1 and 2 is typically within 10 nm which has been very difficult to achieve in the conventional photolithography.

Patent Document 1: Japanese Patent Laid-open Publication No. 2007-208255

Patent Document 2: Japanese Patent Laid-open Publication No. 2010-269304

DISCLOSURE OF THE INVENTION

Problems to be Solved by the Invention

In Patent Documents 1 and 2, there is no description about conditions for performing a plasma etching process of selectively removing the second region with respect to the first region formed by the phase-separation of the block copolymer layer. However, the present inventors have found that it is difficult to selectively etch the second region with respect to the first region by the typical etching process with oxygen plasma.

Accordingly, it is necessary to make it possible to selectively remove the second region with respect to the first region, which is formed by the self-assembly of the block copolymer layer, by performing the plasma etching process.

Means for Solving the Problems

In one exemplary embodiment, a pattern is formed on an underlying layer of a target object by a pattern forming method. The pattern forming method includes (a) forming a block copolymer layer, which includes a first polymer and a second polymer and is configured to be self-assembled, on the underlying layer; (b) processing the target object to form a first region containing the first polymer and a second region containing the second polymer in the block copolymer layer; (c) etching the second region partway in a thickness direction of the second region in a capacitively coupled plasma processing apparatus after the processing of the target object; (d) generating secondary electrons from an upper electrode of the plasma processing apparatus by applying a negative DC voltage to the upper electrode and irradiating the secondary electrons onto the target object, after the etching of the second region; and (e) additionally etching the second region in the plasma processing apparatus after the irradiating of the secondary electrons onto the target object.

According to the exemplary embodiment, since the second region is etched partway in the thickness direction thereof, a surface of the second region is further recessed with respect to a surface of the first region. In this state, if the secondary electrons are irradiated to the surface of the target object, more secondary electrons are irradiated to the first region with respect to the recessed second region. As a result, the first region is further cured than the second region. Then, since the second region is additionally etched, it is possible to selectively etch and remove the second region with respect to the first region.

In the exemplary embodiment, the first polymer may be polystyrene and the second polymer may be poly(methyl methacrylate). In this case, the second region containing poly (methyl methacrylate) is selectively etched with respect to the first region containing polystyrene.

Effect of the Invention

As described above, according to the exemplary embodiments, it is possible to selectively etch and remove the second region with respect to the first region formed through self-assembly of the block copolymer layer by plasma etching.

MODE FOR CARRYING OUT THE INVENTION

Hereinafter, various exemplary embodiments will be explained with reference to the accompanying drawings. Further, in the drawings, parts having substantially the same functions and configurations will be assigned like reference numerals.

Figure 1:
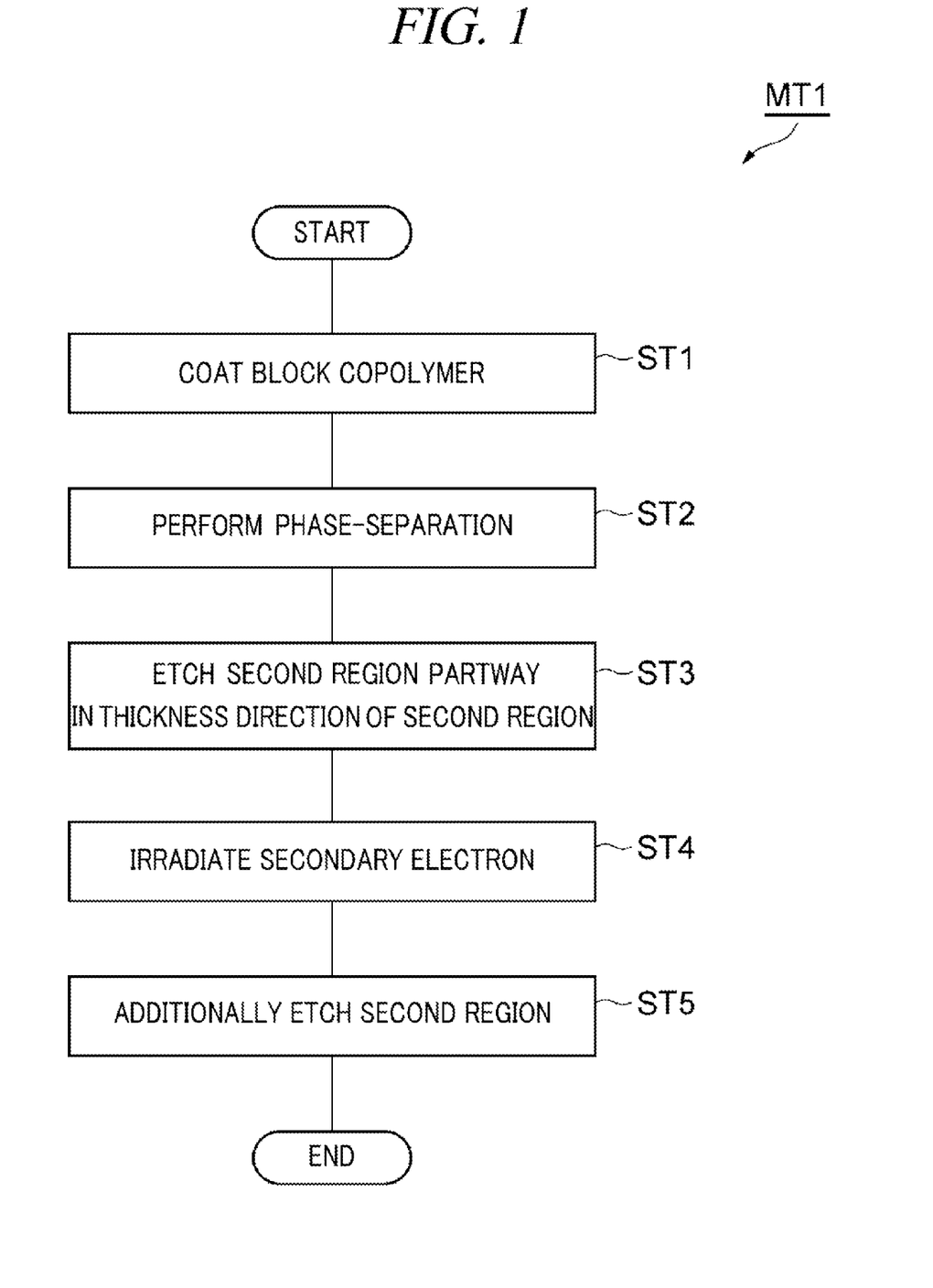
FIG. 1 is a flowchart showing a method of forming a pattern according to an exemplary embodiment.
Figure 2A:
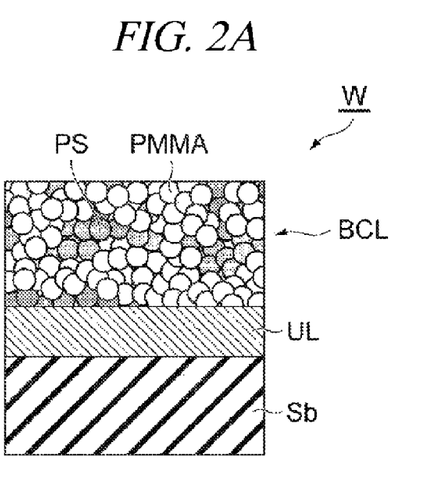
FIG. 2A to FIG. 2D are diagrams illustrating cross sections of products prepared in respective processes illustrated in FIG. 1.

FIG. 1 is a flowchart showing a method of forming a pattern according to an exemplary embodiment. Further, FIG. 2A to FIG. 2D are diagrams illustrating cross sections of products obtained in the respective processes illustrated in FIG. 1. As illustrated in FIG. 1, a method MT1 of forming a pattern according to the exemplary embodiment includes a process ST1, a process ST2, a process ST3, a process ST4, and a process ST5. According to the method MT1, in the process ST1, a block copolymer is coated on a surface of a target object (hereinafter, referred to as "wafer W"). The block copolymer may be coated by using various methods such as a spin-coating method. As a result, a block copolymer layer BCL is formed on the surface of the wafer W as illustrated in FIG. 2A. Further, according to the exemplary embodiment, as illustrated in FIG. 2A, the wafer W includes a substrate Sb made of silicon and an underlying layer UL formed on the substrate Sb. The block copolymer layer BCL is formed on the underlying layer UL. According to the exemplary embodiment, the underlying layer UL is formed of an organic film.

The block copolymer is a self-assembled block copolymer, and includes a first polymer and a second polymer. According to the exemplary embodiment, the block copolymer is polystyrene-block-poly(methyl methacrylate) ("PS-b-PMMA"). PS-b-PMMA includes polystyrene ("PS") as the first polymer and poly(methyl methacrylate) ("PMMA") as the second polymer.

Figure 3A:
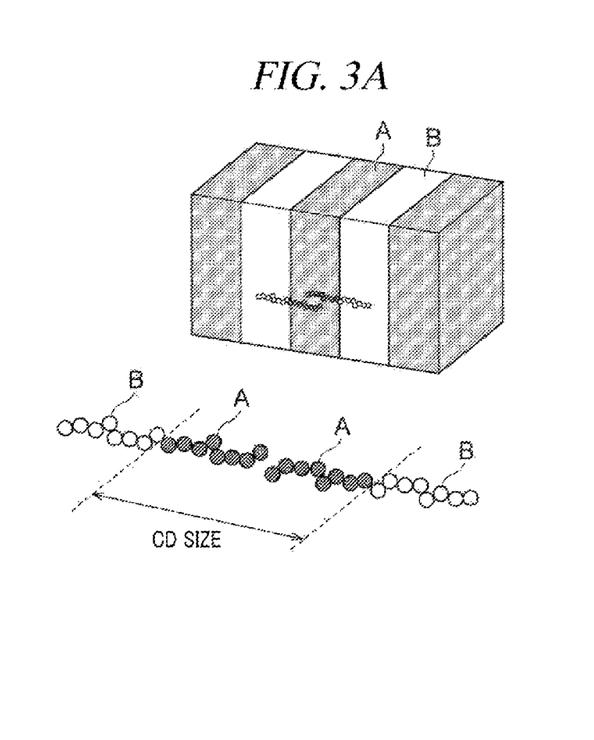
FIG. 3A and FIG. 3B are diagrams for describing self-assembly of a block copolymer.

Herein, the block copolymer, e.g., PS-b-PMMA, and self-assembly thereof will be described with reference to FIG. 3. Each of the PS and the PMMA is a polymer having a molecular diameter of 0.7 nm. A block copolymer layer containing the PS and the PMMA, which are not mixed with each other, is coated on the underlying film UL, so that the block copolymer layer BCL is formed. Then, a heat-treatment (annealing) is performed to the wafer W at a temperature from room temperature (25° C.) to less than or equal to 300° C. As a result, the block copolymer layer BCL is phase-separated. In general, the annealing is performed at a temperature from 200° C. to 250° C. If, however, the heat-treatment is performed at a temperature higher than 300° C., the block copolymer layer BCL may not be phase-separated, but the PS and the PMMA may be arranged randomly. Further, even if the temperature is returned back to the room temperature after the phase-separation, the phase-separated state of the block copolymer layer BCL is maintained.

When a polymer length of each polymer is short, interaction (repulsive force) is weakened and a hydrophilic property is strengthened. On the other hand, when a polymer length of each polymer is long, interaction (repulsive force) is strengthened and a hydrophobic property is also strengthened. By using such a polymer property, a phase-separation structure of the PS and the PMMA can be prepared as shown in, for example, FIG. 3A and FIG. 3B. FIG. 3A illustrates a phase-separation structure when a polymer A and a polymer B have the substantially same polymer lengths. For example, the polymer A is the PS and the polymer B is the PMMA. In the structure illustrated in FIG. 3A, the interactions between the respective polymers are the same. Accordingly, when the block copolymer layer BCL is heat-treated at a temperature of 250° C., the polymer A and the polymer B are self-assembled and phase-separated in a line shape. That is, the polymer A forms a first region in a line shape, and the polymer B forms a second region in a line shape between the first regions. For example, with this phase-separation structure, if the second region containing the polymer B is removed, a periodic pattern of a line-and-space (L/S) can be formed. This periodic pattern can be applied as a pattern for manufacturing devices such as semiconductor devices.

Figure 3B:
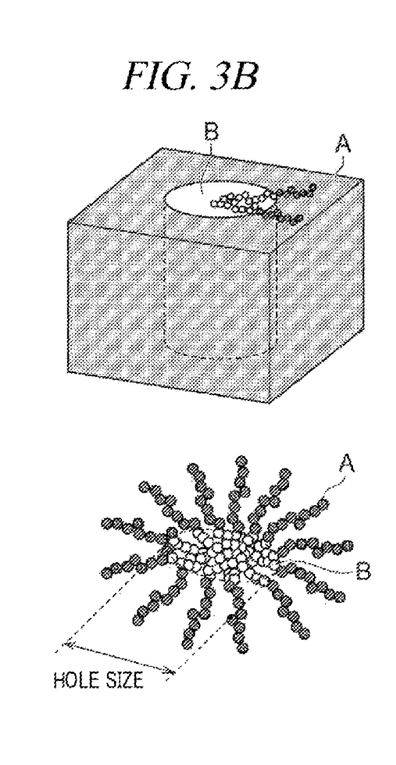

FIG. 3B illustrates a phase-separation structure when the polymer A and the polymer B have different polymer lengths, i.e., a polymer length of the polymer A is longer than a polymer length of the polymer B. In the structure illustrated in FIG. 3B, interaction (repulsive force) of the polymer A is strong, whereas interaction (repulsive force) of the polymer B is weak. When the block copolymer layer BCL is heat-treated at a temperature of 250° C., the polymer A is self-assembled outwards while the polymer B is self-assembled inwards due to the strength difference in the interactions between the polymers. That is, the polymer B is self-assembled to form a second region in a cylinder shape, and the polymer A is self-assembled to form a first region to surround the cylinder-shaped region. For example, with this phase-separation structure including the first region and the second region, if the second region is removed, a periodic pattern of a hole can be formed. This periodic pattern can also be applied as a pattern for manufacturing devices such as semiconductor devices.

Figure 2B:
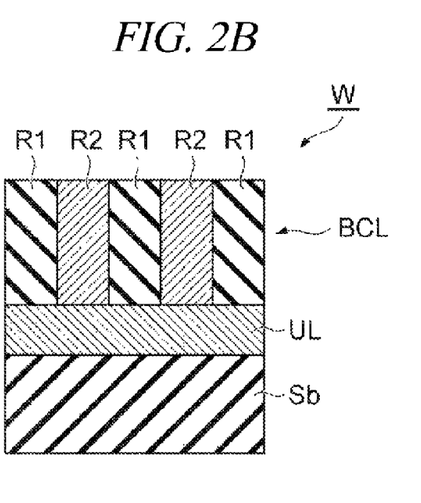

Referring to FIG. 1 again, in the process ST2 of the method MT1, the phase-separation of the block copolymer layer BCL is performed. According to the exemplary embodiment, in the process ST2, while the wafer W is heated at a temperature of 200° C. to 300° C., the block copolymer layer BCL is phase-separated. Through the process ST2, as illustrated in FIG. 2B, a first region R1 containing the first polymer and a second region R2 containing the second polymer are formed in the block copolymer layer BCL. As described above, the first region R1 and the second region R2 may be alternately formed to have a line pattern. Otherwise, the second region R2 may be a cylinder-shaped region, and the first region R1 may surround the cylinder-shaped second region R2.

Figure 4:
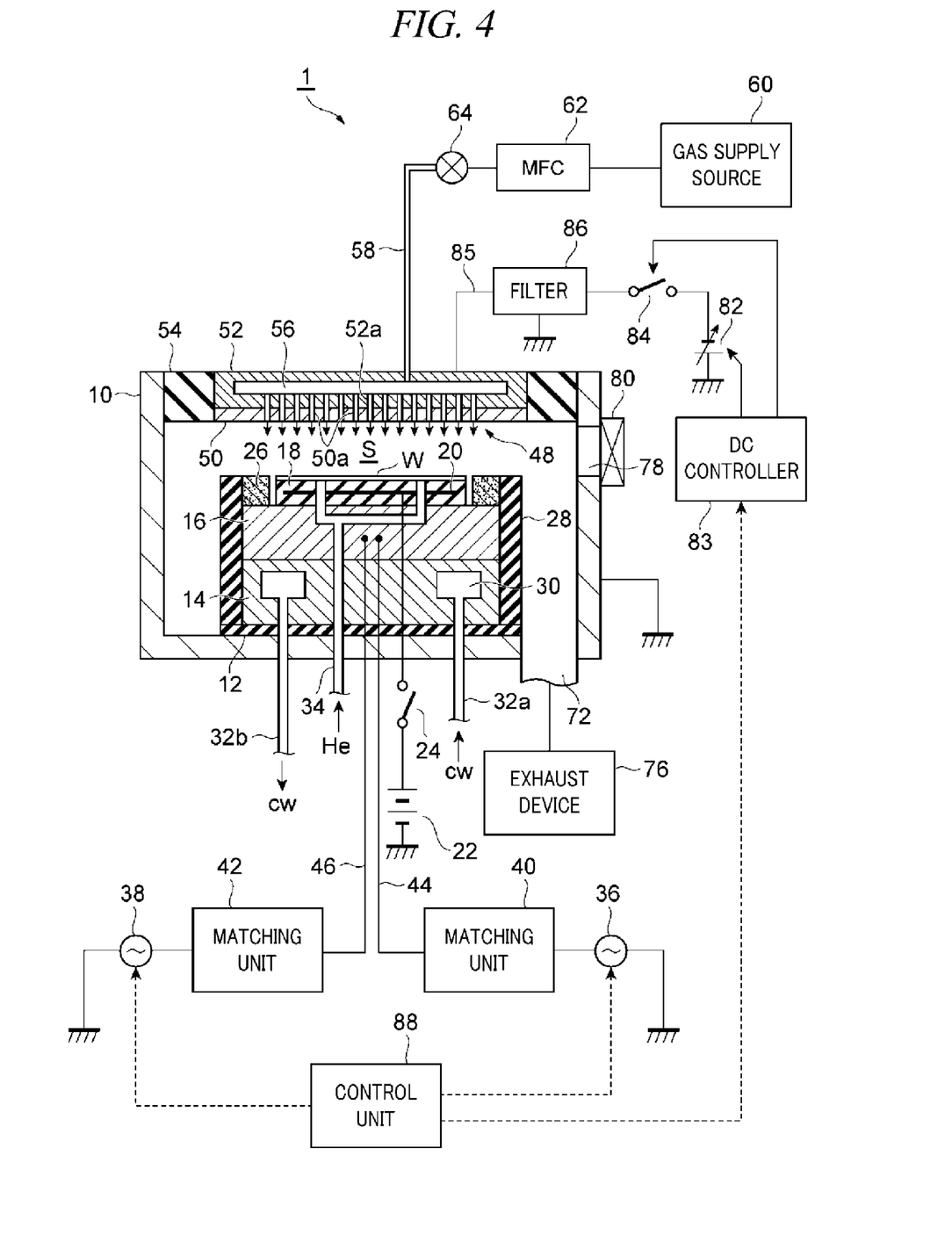
FIG. 4 is a diagram schematically illustrating a plasma processing apparatus.

Prior to the process ST3, the wafer W is transferred into a plasma processing apparatus. FIG. 4 is a diagram schematically illustrating a plasma processing apparatus in which the method MT1 can be performed. A plasma processing apparatus 1 illustrated in FIG. 4 is of a capacitively coupled parallel plate type, and includes a substantially cylinder-shaped chamber (processing vessel) 10. The chamber 10 is grounded. An inner surface of the chamber 10 is alumite-treated (anodically oxidized).

A cylindrical susceptor supporting table 14 is provided at a bottom of the chamber 10 via an insulating plate 12 such as ceramic. A susceptor 16 made of, e.g., aluminum is placed on the susceptor support 14.

An electrostatic chuck 18 configured to hold the wafer W by an electrostatic attracting force is provided on a top surface of the susceptor 16. The electrostatic chuck 18 includes a pair of insulating layers or insulating sheets, and a chuck electrode 20 interposed therebetween. The chuck electrode 20 is formed of a conductive film. The chuck electrode 20 is electrically connected to a DC power supply 22 via a switch 24. The wafer W is attracted to and held on the electrostatic chuck 18 by an electrostatic force generated by a DC voltage applied from the DC power supply 22. A focus ring 26 is provided around the electrostatic chuck 18 and on the susceptor 16 in order to improve the etching uniformity over the entire surface of the wafer W. The focus ring 26 is made of, for example, silicon. A cylindrical inner wall member 28 made of, e.g., quartz is attached to side surfaces of the susceptor 16 and the susceptor supporting table 14.

A coolant path 30 is formed within the susceptor supporting table 14. For example, the coolant path 30 is annularly extended within the susceptor supporting table 14. A coolant cw, e.g., cooling water, of a preset temperature is supplied into and circulated through the coolant path 30 via lines 32a and 32b from an external chiller unit. A processing temperature of the wafer W on the susceptor 16 can be controlled by adjusting the temperature of the coolant cw. Further, a heat transfer gas such as a He gas is supplied from a heat transfer gas supply device (not illustrated) into a space between a top surface of the electrostatic chuck 18 and a rear surface of the wafer W through a gas supply line 34.

Further, a first high frequency power supply 36 for plasma generation and a second high frequency power supply 38 for ion attraction are electrically connected to the susceptor 16 via matching units 40 and 42 and power feed rods 44 and 46, respectively.

The first high frequency power supply 36 is configured to generate a high frequency power having a first frequency of, for example, 40 MHz suitable for plasma generation. Further, the first frequency may be 60 MHz or 100 MHz. Meanwhile, the second high frequency power supply 38 is configured to generate a high frequency power having a relatively lower frequency of, for example, a second frequency of 13 MHz suitable for attracting ions of plasma onto the wafer W on the susceptor 16.

An upper electrode 48 is provided above the susceptor 16. The upper electrode 48 faces the susceptor 16 in parallel. The upper electrode 48 includes an electrode plate 50 and an electrode supporting body 52 that detachably supports the electrode plate 50. The electrode plate 50 includes multiple gas discharge holes 50a. The electrode plate 50 may be formed of a semiconductor material such as Si and SiC. Further, the electrode supporting body 52 is formed of, for example, aluminum, and a surface thereof is alumite-treated. The electrode plate 50 and the electrode supporting body 52 are provided at a top portion of the chamber 10 via a ring-shaped insulator 54. The ring-shaped insulator 54 may be made of, for example, alumina. A plasma generation space, i.e., a processing space S is formed between the upper electrode 48 and the susceptor 16.

The electrode supporting body 52 includes a gas buffer room 56 therein. Further, the electrode supporting body 52 includes multiple gas through holes 52a which communicate the gas buffer room 56 and the gas discharge holes 50a of the electrode plate 50. A gas supply source 60 is connected to the gas buffer room 56 via a gas supply line 58. A mass flow controller (MFC) 62 and an opening/closing valve 64 are provided on the gas supply line 58. After a processing gas is introduced into the gas buffer room 56 from the gas supply source 60, the processing gas is discharged in a shower shape through the gas discharge holes 50a of the electrode plate 50 into the processing space S toward the wafer W on the susceptor 16. As such, the upper electrode 48 also serves as a shower head configured to supply the processing gas into the processing space S.

An annular space formed among the susceptor 16, the susceptor supporting table 14 and a sidewall of the chamber 10 serves as an exhaust space. An exhaust port 72 of the chamber 10 is formed at a bottom of the exhaust space. The exhaust opening 72 is connected to an exhaust device 76 via an exhaust line. The exhaust device 76 includes a vacuum pump such as a turbo molecular pump and is configured to evacuate an inside of the chamber 10, particularly, the processing space S to a desired vacuum level. Further, a gate valve 80 configured to open and close a carry-in/out opening 78 for the wafer W is attached to the sidewall of the chamber 10.

A variable DC power supply 82 is provided at an outside of the chamber 10. One terminal, i.e., an output terminal, of the variable DC power supply 82 is electrically connected to the upper electrode 48 via a switch 84 and a DC power feed line 85. The variable DC power supply 82 is configured to generate a negative DC voltage. The negative DC voltage is in the range of −900 V to 0 V and may be, for example, −900 V. The other terminal of the variable DC power supply 82 is grounded. An absolute value of the output (voltage, current) of the variable DC power supply 82 and an on/off operation of the switch 84 are controlled by a DC controller 83 under a control of a control unit 88, which will be described later.

A filter circuit 86 is provided on the DC power feed line 85. The filter circuit 86 is configured to apply a DC voltage VDC from the variable DC power supply 82 to the upper electrode 48. Further, the filter circuit 86 allows the high frequency power introduced to the DC power feed line 85 from the susceptor 16 through the processing space S and the upper electrode 48 to flow toward a ground line, so that the introduction of the high frequency power toward the variable DC power supply 82 is suppressed.

The control unit 88 may include a CPU (Central Processing Unit), a ROM (Read Only Memory), and a RAM (Random Access Memory). The CPU controls implementation of processes according to various recipes stored in, e.g., the RAM.

In case of etching the wafer W in the plasma processing apparatus 1, the gate valve 80 is first opened, and the wafer W held on a transfer arm is carried into the chamber 10. Then, the wafer W is placed on the electrostatic chuck 18. After the wafer W is carried, the gate valve 80 is closed. Subsequently, a processing gas is introduced into the chamber 10 from the gas supply source 60 at a preset flow rate and a preset flow rate ratio, and the inside of the chamber 10 is decompressed to a predetermined pressure by the exhaust device 76. Further, a high frequency power is applied from the first high frequency power supply 36 to the susceptor 16, and if necessary, a high frequency bias power is applied from the second high frequency power supply 38 to the susceptor 16. Thus, the processing gas introduced in a shower shape from the shower head is excited into plasma. Then, the wafer W is etched by the active species such as radicals or ions in the plasma.

FIG. 1 will be referred to again. After the process ST2 and before the process ST3, the wafer W is carried into the chamber of the plasma processing apparatus and placed on the electrostatic chuck, as illustrated in FIG. 1. Then, the process ST3 of the method MT1 is performed.

In the process ST3, the second region R2 of the block copolymer layer BCL is etched partway in a thickness direction of the second region R2. When performing the process ST3 in the plasma processing apparatus 1, a processing gas is supplied from the gas supply source 60 into the chamber 10, and the inside of the chamber 10 is decompressed to a predetermined pressure by the exhaust device 76. Further, a high frequency power is applied from the first high frequency power supply 36 to the susceptor 16. Furthermore, in the process ST3, if necessary, a high frequency bias power may be applied from the second high frequency power supply 38 to the susceptor 16. The processing gas used in the process ST3 may include oxygen since the processing gas is required to etch the second region R2 containing the second polymer. For example, the processing gas may include an $O_2$ gas. Further, the processing gas may further include a rare gas such as an Ar gas.

Figure 2C:
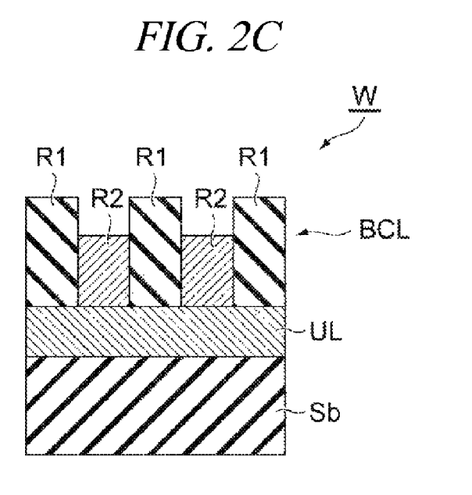

In the process ST3, the block copolymer layer BCL formed of an organic material is etched from its surface by active species of oxygen. Herein, an etching rate in the second region R2 formed of the second polymer is higher than that in the first region R1 formed of the first polymer. Therefore, through the process ST3, a film thickness of the second region R2 is greatly reduced. As a result, as illustrated in FIG. 2C, a surface of the second region R2 is lower than a surface of the first region R1. That is, the second region R2 is further recessed with respect to the first region R1.

Then, the process ST4 of the method MT1 is performed. In the process ST4, secondary electrons are irradiated to the wafer W. When performing the process ST4 in the plasma processing apparatus 1, a processing gas for generating cations is supplied from the gas supply source 60 into the chamber 10 of the plasma processing apparatus 1, and the inside of the chamber 10 is decompressed to a predetermined pressure by the exhaust device 76. Further, a negative DC voltage is applied from the variable DC power supply 82 to the upper electrode 48. The processing gas used in the process ST4 can generate cations while being excited, and may include any one of a $H_2$ gas, a rare gas such as an Ar gas, and a fluorocarbon-based gas such as a $CF_4$ gas, or may include a mixed gas including one or more of these gases. Furthermore, in the process ST4, a high frequency power is applied from the first high frequency power supply 36 to the susceptor 16 in order to excite the processing gas. Moreover, in the process ST4, if necessary, a high frequency bias power may be applied from the second high frequency power supply 38 to the susceptor 16.

Figure 5:
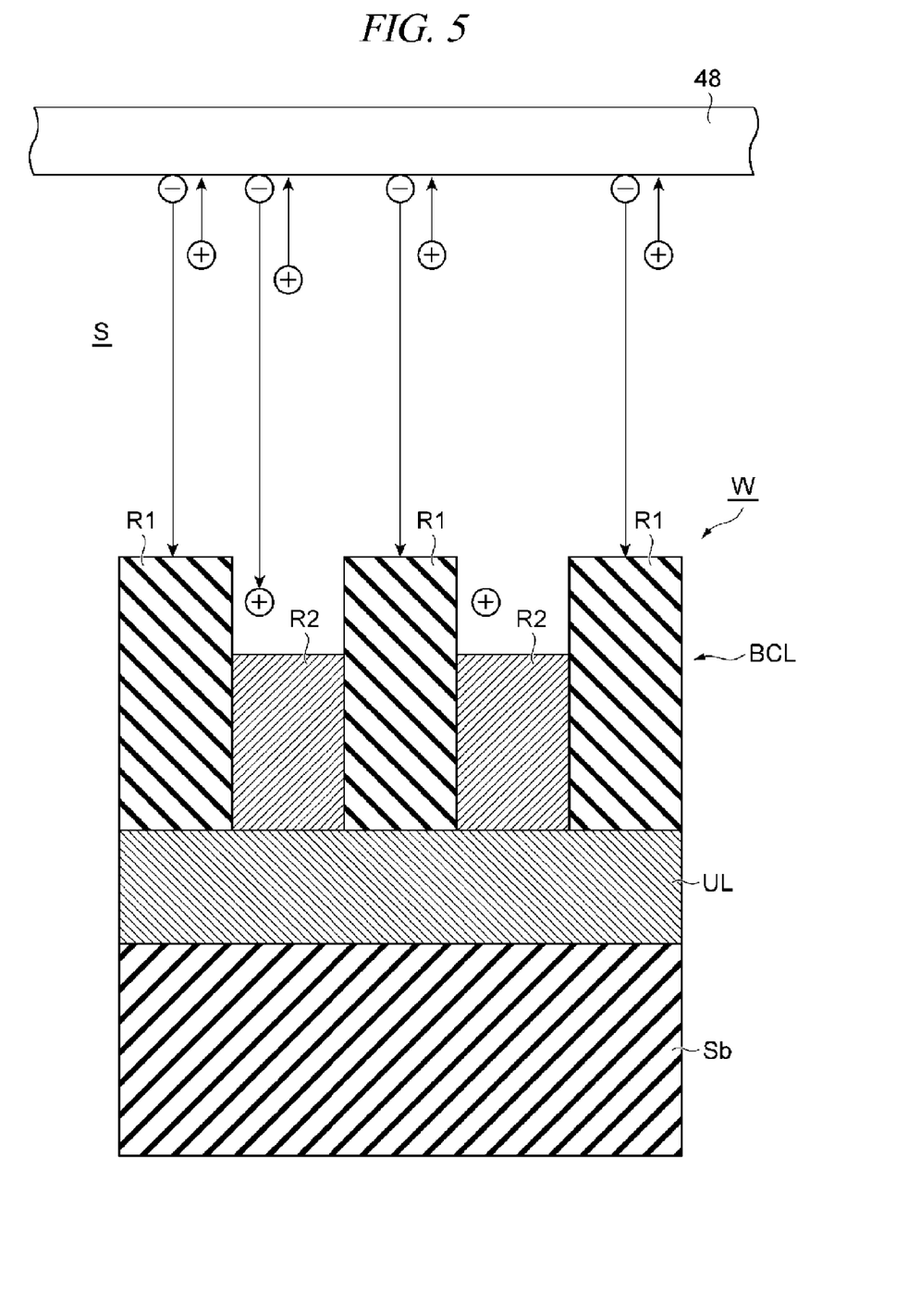
FIG. 5 is a diagram for explaining a process ST4 illustrated in FIG. 1.

FIG. 5 will be referred to hereinafter. FIG. 5 is a diagram for explaining the process ST4. In FIG. 5, "+" surrounded by a circle represents a cation and "−" surrounded by a circle represents a secondary electron. When the processing gas is supplied to the processing space S and the high frequency power is supplied from the first high frequency power supply 36 to the susceptor 16, the processing gas is then excited to generate cations within the processing space S. In a state where the cations are generated within the processing space S, if the negative DC voltage is applied to the upper electrode 48, the cations collide with the upper electrode 48 as illustrated in FIG. 5. Thus, secondary electrons are emitted from the upper electrode 48, and the secondary electrons are irradiated onto the wafer W. If the secondary electrons are irradiated onto the wafer W, the first polymer constituting the first region R1 is then cured. Meanwhile, in the second region R2, which is further recessed with respect to the first region R1, an amount of the irradiated secondary electrons may be decreased, or the secondary electrons may not be irradiated. It is assumed that this is because the second region R2 is narrow and recessed or the secondary electrons are consumed to be neutralized by the cations remaining on the recessed second region R2, or this is affected by both of the above-described reasons. As a result of the process ST4, the first region R1 is further cured than the second region R2.

Then, as illustrated in FIG. 1, the process ST5 of the method MT1 is performed. In the process ST5, the second region R2 of the block copolymer layer BCL is additionally etched. According to the exemplary embodiment, the second region R2 is etched to a surface of the underlying layer UL. When performing the process ST5 in the plasma processing apparatus 1, the process ST5 is performed in the same manner as the etching process in the process ST3. That is, in the process ST5, the processing gas is supplied from the gas supply source 60 into the chamber 10, and the inside of the chamber 10 is decompressed to a predetermined pressure by the exhaust device 76. Further, the high frequency power is applied from the first high frequency power supply 36 to the susceptor 16. Furthermore, in the process ST5, if necessary, the high frequency bias power may be applied from the second high frequency power supply 38 to the susceptor 16. The processing gas used in the process ST5 may include oxygen since the processing gas is required to etch the second region R2 containing the second polymer. For example, the processing gas may include an $O_2$ gas. Further, the processing gas may further include a rare gas such as an Ar gas.

Figure 2D:
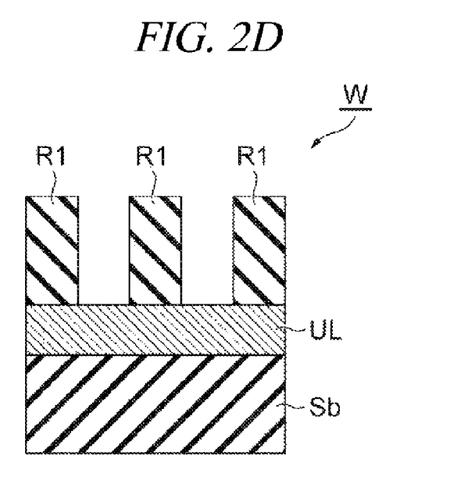

As described above, through the process ST4, the first region R1 has been cured as compared with the second region R2. Therefore, in the process ST5 as compared with the process ST3, the etching rate in the second region R2 is higher than that in the first region R1. That is, as a result of the process ST4, the second region R2 is further selectively etched in the process ST5. Through the process ST5, the first region R1 remains on the underlying layer UL as illustrated in FIG. 2D. A pattern formed by the first region R1 may be used as a mask for etching the underlying layer UL.

Hereinafter, the exemplary embodiment will be described in more detail with reference to experimental examples, but is not be limited to the following the experimental examples.

<Prepare Experimental Example 1 and Comparative Example 1>

Firstly, a block copolymer layer including the PS as the first polymer and the PMMA as the second polymer is formed on a wafer (process ST1). Then, the wafer is heated at a temperature of 250° C. such that the second polymer forms the cylinder-shaped second region and the first polymer forms the first region surrounding the second region (process ST2). Then, the processes ST3 to ST5 are performed in the plasma processing apparatus 1 under the following processing conditions, so that the wafer of the experimental example 1 is obtained.

(Conditions for Process ST3)
Pressure within chamber 10: 75 mT (10 Pa)
High frequency power of first high frequency power supply 36: 40 MHz, 100 W
High frequency bias power of second high frequency power supply: 13 MHz, 0 W
DC voltage of variable DC power supply 82: 0 V
Processing gas: $O_2$ of 50 sccm, Ar of 850 sccm
Wafer temperature: 30° C.
Processing time: 10 seconds (Conditions for Process ST4)
Pressure within chamber 10: 50 mT (6.666 Pa)
High frequency power of first high frequency power supply 36: 40 MHz, 300 W
High frequency bias power of second high frequency power supply: 13 MHz, 0 W
DC voltage of variable DC power supply 82: −900 V
Processing gas: $H_2$ of 150 sccm, Ar of 1200 sccm, $CF_4$ of 30 sccm
Wafer temperature: 30° C.
Processing time: 20 seconds (Conditions for Process ST5)
Pressure within chamber 10: 75 mT (10 Pa)
High frequency power of first high frequency power supply 36: 40 MHz, 100 W
High frequency bias power of second high frequency power supply: 13 MHz, 0 W
DC voltage of variable DC power supply 82: 0 V
Processing gas: $O_2$ of 50 sccm, Ar of 850 sccm
Wafer temperature: 30° C.
Processing time: 10 seconds Further, in order to prepare the comparative example 1, processes are performed under the same processing conditions as the process ST1 and the process ST2 for preparing the experimental example 1. Then, an etching process is performed in the plasma processing apparatus 1 under the following processing conditions, so that the wafer of the comparative example 1 is obtained.

(Etching Conditions for Preparing Comparative Example 1)
Pressure within chamber 10: 75 mT (10 Pa)
High frequency power of first high frequency power supply 36: 40 MHz, 100 W
High frequency bias power of second high frequency power supply: 13 MHz, 0 W
DC voltage of variable DC power supply 82: 0 V
Processing gas: $O_2$ of 50 sccm, Ar of 850 sccm
Wafer temperature: 30° C.
Processing time: 20 seconds <Evaluation of Experimental Example 1 and Comparative Example 1>

Figure 6A:
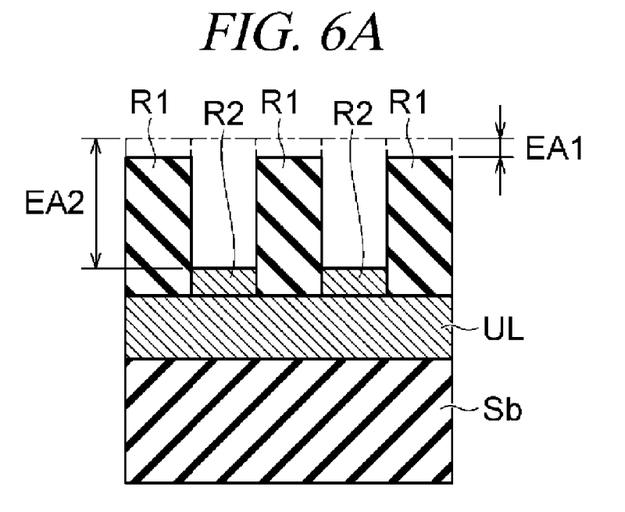
FIG. 6A and FIG. 6B are diagrams for describing evaluation parameters of respective experimental examples.
Figure 6B:
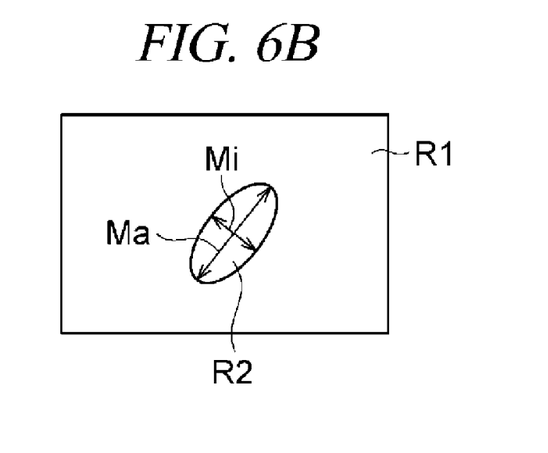

SEM images of a cross section and a top surface of the wafer of the experimental example 1 and the wafer of the comparative example 1 are obtained. Further, by using the SEM image of the cross section as illustrated in FIG. 6A, a film thickness variation of the first region R1 between before and after the process and a film thickness variation of the second region R2 between before and after the process are obtained. These variations correspond to an etched amount EA1 of the first region R1 and an etched amount EA2 of the second region R2, respectively. Further, a value of EA2/EA1 is calculated with respect to each of the wafer of the experimental example 1 and the wafer of the comparative example 1. Furthermore, EA2/EA1 of a high value represents that the second region R2 is further selectively etched with respect to the first region R1. Further, by using the SEM image of the top surface as illustrated in FIG. 6B, a major diameter Ma and a minor diameter Mi of an opening formed by etching the second region R2 are obtained, and a value of Ma/Mi is calculated as a parameter that represents the roundness of the opening. Furthermore, as the value of Ma/Mi is closer to 1, the shape of the opening is closer to a perfect circle. As a result of the evaluation, the value of EA2/EA1 of the experimental example 1 is 13.8 and the value of Ma/Mi of the experimental example 1 is 1.15. Meanwhile, the value of EA2/EA1 of the comparative example 1 is 8.0 and the value of Ma/Mi of the comparative example 1 is 1.21. It is found out from the above result that the method MT1 for preparing the experimental example 1 makes it possible to further selectively etch the second region R2 and etch the second region R2 such that the opening formed after the second region R2 is etched can be closer to a perfect circle, as compared with the method for preparing the comparative example 1, i.e., the method in which the block copolymer layer is etched without performing the process ST4 of irradiating the secondary electrons.

<Prepare Experimental Examples 2 and 3 and Comparative Example 2>

The processes ST1 to ST5 are performed under the same processing conditions for preparing the experimental example 1, so that a wafer of the experimental example 2 is obtained. Further, the processes ST1 to ST5 are performed under the same conditions for preparing the experimental example 2 except that the processing time for the process ST3 is 5 seconds and the processing time for the process ST5 is 15 seconds, so that a wafer of the experimental example 3 is obtained. Furthermore, a block copolymer layer is obtained under the same processing conditions as the process ST1 and the process ST2 for preparing the experimental example 2. Then, a curing process and an etching process are performed under the following processing conditions, so that a wafer of the comparative example 2 is obtained.

(Curing Conditions for Preparing Comparative Example 2)
Pressure within chamber 10: 50 mT (6.666 Pa)
High frequency power of first high frequency power supply 36: 40 MHz, 300 W
High frequency bias power of second high frequency power supply: 13 MHz, 0 W
DC voltage of variable DC power supply 82: −900 V
Processing gas: $H_2$ of 150 sccm, Ar of 1200 sccm, $CF_4$ of 30 sccm
Wafer temperature: 30° C.
Processing time: 20 seconds (Etching Conditions for Preparing Comparative Example 2)
Pressure within chamber 10: 75 mT (10 Pa)
High frequency power of first high frequency power supply 36: 40 MHz, 100 W
High frequency bias power of second high frequency power supply: 13 MHz, 0 W
DC voltage of variable DC power supply 82: 0 V
Processing gas: $O_2$ of 50 sccm, Ar of 850 sccm
Wafer temperature: 30° C.
Processing time: 20 seconds <Evaluation of Experimental Examples 2 and 3 and Comparative Example 2>

SEM images of a cross section and a top surface of the wafers of the experimental examples 2 and 3 and the wafer of the comparative example 2 are obtained. Further, a value of EA2/EA1 and a value of Ma/Mi are also calculated with respect to the wafers of the experimental examples 2 and 3 and the wafer of the comparative example 2. As a result of the evaluation, the value of EA2/EA1 of the experimental example 2 is 13.8 and the value of Ma/Mi of the experimental example 2 is 1.15. Further, the value of EA2/EA1 of the experimental example 3 is 10.9 and the value of Ma/Mi of the experimental example 3 is 1.33. Meanwhile, the value of EA2/EA1 of the comparative example 2 is 7.0 and the value of Ma/Mi of the comparative example 2 is 1.38.

It is found out from the above result that in the comparative example 2 in which the etching process of making a height difference between a surface of the first region R1 and a surface of the second region R2, i.e., the etching process of further recessing the second region R2 than the first region R1, is not performed and the block copolymer layer is etched after the secondary electrons are irradiated, an etching selectivity of the second region R2 with respect to the first region R1 becomes considerably lower as compared with the experimental examples 2 and 3 and a roundness of the opening formed after the etching becomes also considerably lower as compared with the experimental example 2. It is assumed that this is because if the second region R2 is not further recessed than the first region R1 and the secondary electrons are irradiated, the second region R2 is also cured in the same manner as the first region R1, so that the second region R2 cannot be selectively etched with respect to the first region R1 in a subsequent etching process. Meanwhile, it is found out that the method MT1 for preparing the experimental examples 2 and 3 makes it possible to selectively etch the second region R2 and etch the second region R2 such that the opening formed after the second region R2 is etched can be closer to a perfect circle, as compared with the method for preparing the comparative example 2. Also, as a result of comparison between the experimental example 2 and the experimental example 3, it is found out that the second region R2 can be further selectively etched and a hole formed after the second region R2 is removed has a shape closer to a perfect circle when the etching process is performed for 10 seconds, rather than 5 seconds, before the secondary electrons are irradiated.

There has been described the exemplary embodiment, but various modifications or changes can be made without limitation to the above-described exemplary embodiment. For example, the block copolymer is not limited to PS-b-PMMA. Other than PS-b-PMMA, the block copolymer may be, for example, a chain block copolymer or block copolymers having different structures such as a star copolymer, a branched copolymer, a hyper-branched copolymer, and a graft copolymer.

A block may be formed of various kinds of monomers that can be polymerized. Here, the block may be, but not limited to, polyolefin including polydiene, polyether including poly (alkylene oxide) (e.g., poly (ethylene oxide), poly (propylene oxide), poly (butylene oxide), or a random combination or block copolymer thereof), poly ((meta) acrylate), polystyrene, polyester, polyorgano siloxane, polyorgano germane, or the like.

A block of a block copolymer may be a monomer, and may include $C_{2-30}$ olefin monomer, $C_{1-30}$ alcohol-originated (meta) acrylate monomer, an inorganic component containing monomer having Fe, Si, Ge, Sn, Al and Ti as a base, or a combination including at least one of the mentioned monomers. By way of non-limiting example, a monomer used in the block may be, as a $C_{2-30}$ olefin monomer, ethylene, propylene, 1-buthene, 1,3-butadiene, isoprene, vinyl acetate, dihydropyran, nobornene, maleic anhydride, styrene, 4-hydroxystyrene, 4-acetoxystyrene, 4-methylstyrene or α-methylstyrene. Further, a monomer, as a (meta) acrylate monomer, may be, but not limited to, methyl (meta) acrylate, ethyl (meta) acrylate, n-propyl (meta) acrylate, isopropyl (meta) acrylate, n-butyl (meta) acrylate, isobutyl (meta) acrylate, n-pentyl (meta) acrylate, isopentyl (meta) acrylate, neopentyl (meta) acrylate, n-hexyl (meta) acrylate, cyclohexyl (meta) acrylate, isobonyl (meta) acrylate, hydroxyethyl (meta) acrylate, or the like. Combinations of two or more of these monomers may be used. A homopolymer block may include a block formed by using styrene (e.g., a polystyrene block) or (meta) acrylate homopolymer block such as poly (methyl metacrylate). A random block may include, for example, a block of randomly polymerized styrene and methyl metacrylate (e.g., poly (styrene-co-methyl metacrylate)). In general, a copolymer block may include a block of styrene and maleic anhydride. Under most of conditions, maleic anhydride cannot be homo-polymerized. Accordingly, it is known to form a structure (e.g., poly (styrene-alt-maleic anhydride) in which two molecules of styrene and maleic anhydride are repeated. These blocks are nothing more than examples, and the illustrative embodiment may not be limited thereto.

Further, the block copolymer may include, but not limited to, poly (styrene-b-vinylpyridine), poly (styrene-b-butadiene), poly (styrene-b-isoprene), poly (styrene-b-methyl metacrylate), poly (styrene-b-alkenyl aromatic), poly (isoprene-b-ethylene oxide), poly (styrene-b-(ethylene-propylene), poly (ethylene oxide-b-caprolactone), poly (butadiene-b-ethylene oxide), poly (styrene-b-t-butyl (meta) acrylate), poly (methyl metacrylate-b-t-butyl metacrylate), poly (ethylene oxide-b-propylene oxide), poly (styrene-b-tetrahydrofuran), poly (styrene-b-isoprene-b-ethylene oxide), poly (styrene-b-dimethylsiloxane), poly (methyl metacrylate-b-dimethylsiloxane) or a diblock- or triblock copolymer of a combination including at least one of the aforementioned block copolymers.

Desirably, a block copolymer has an overall molecular weight and a polydispersity suitable for performing a further process. For example, the block copolymer may have a weight average molecular weight $M_w$ ranging from 3,000 g/mol to 400,000 g/mol. The block copolymer may have a number average molecular weight $M_n$ ranging from 1,000 to 200,000. The block copolymer may also have a polydispersity $M_w/M_n$ ranging from 1.01 to 6, but is not particularly limited thereto. By way of example, the two molecular weights $M_w$ and $M_n$ may be determined by using a universal calibration method by which the molecular weights are corrected with respect to polystyrene standard based on a gel permeation chromatography.

EXPLANATION OF REFERENCE NUMERALS

1: Plasma processing apparatus
10: Chamber
16: Susceptor
18: Electrostatic chuck
36: First high frequency power supply
38: Second high frequency power supply
48: Upper electrode
82: Variable DC power supply
W: Wafer
BCL: Block copolymer layer
R1: First region
R2: Second region

We claim:
1. A pattern forming method of forming a pattern on an underlying layer of a target object, comprising:
   forming a block copolymer layer, which includes a first polymer and a second polymer and is configured to be self-assembled, on the underlying layer;
   processing the target object to form a first region containing the first polymer and a second region containing the second polymer in the block copolymer layer;
   etching the second region partway in a thickness direction of the second region in a capacitively coupled plasma processing apparatus after the processing of the target object;
   generating secondary electrons from an upper electrode of the plasma processing apparatus by applying a negative DC voltage to the upper electrode and irradiating the secondary electrons onto the target object, after the etching of the second region; and
   additionally etching the second region in the plasma processing apparatus after the irradiating of the secondary electrons onto the target object.
2. The pattern forming method of claim 1,
   wherein the first polymer is polystyrene and the second polymer is poly(methyl methacrylate).

* * * * *